United States Patent
Matsubara et al.

(10) Patent No.: US 7,098,683 B2
(45) Date of Patent: Aug. 29, 2006

(54) MOTOR DRIVING SYSTEM HAVING POWER SEMICONDUCTOR MODULE LIFE DETECTION FUNCTION

(75) Inventors: Shunsuke Matsubara, Yamanashi (JP); Shinichi Horikoshi, Yamanashi (JP); Hajime Makita, Yamanashi (JP)

(73) Assignee: Fanuc LTD, Yamanashi (JP)

( * ) Notice: Subject to any disclaimer, the term of this patent is extended or adjusted under 35 U.S.C. 154(b) by 0 days.

(21) Appl. No.: 11/092,552

(22) Filed: Mar. 29, 2005

(65) Prior Publication Data
US 2005/0212549 A1    Sep. 29, 2005

(30) Foreign Application Priority Data
Mar. 29, 2004 (JP) ............... 2004-096175

(51) Int. Cl.
*G01R 31/34* (2006.01)
(52) U.S. Cl. .................................... 324/772
(58) Field of Classification Search ............ 324/772; 340/652
See application file for complete search history.

(56) References Cited

U.S. PATENT DOCUMENTS

| | | | | |
|---|---|---|---|---|
| 5,176,310 A | * | 1/1993 | Akiyama et al. | 228/180.5 |
| 5,347,418 A | * | 9/1994 | Ando et al. | 361/104 |
| 5,673,028 A | * | 9/1997 | Levy | 340/635 |
| 6,031,281 A | * | 2/2000 | Kang et al. | 257/692 |
| 6,140,926 A | * | 10/2000 | Hayden et al. | 340/635 |
| 6,344,973 B1 | * | 2/2002 | Feustel et al. | 361/760 |
| 6,452,502 B1 | * | 9/2002 | Dishongh et al. | 340/635 |
| 6,486,548 B1 | * | 11/2002 | Nakatsu et al. | 257/690 |
| 6,838,891 B1 | * | 1/2005 | Ohya et al. | 324/754 |
| 2001/0002723 A1 | * | 6/2001 | Nishimura | 257/666 |
| 2002/0036355 A1 | * | 3/2002 | Young et al. | 257/787 |
| 2002/0093360 A1 | | 7/2002 | Nagata | |
| 2002/0171155 A1 | * | 11/2002 | Fujihira | 257/780 |

FOREIGN PATENT DOCUMENTS

| | | |
|---|---|---|
| EP | 1 398 639 A2 | 3/2004 |
| JP | 5-74876 A | 3/1993 |
| JP | 2000-183117 A | 6/2000 |
| JP | 2003-303845 A | 10/2003 |

\* cited by examiner

*Primary Examiner*—Hezron Williams
*Assistant Examiner*—Ryan Christensen
(74) *Attorney, Agent, or Firm*—Drinker Biddle & Reath LLP

(57) ABSTRACT

In the motor driving system, a unit to predict the separation of the wire is built into the power semiconductor module thereby to predict that the time of separation of the wire is approaching before the actual separation of the wire. Thus, the time to replace the power semiconductor module used for power devices such as the motor driving system is clarified to prevent an operation failure of the motor driving system from occurring. The power semiconductor module (1) has a power semiconductor chip (2) mounted thereon, and the power semiconductor chip (2) includes a main circuit wire (4) and a dummy wire (5) connected to the electrode (3) of the power semiconductor. The dummy wire is set to a lower connection strength than the main circuit wire.

16 Claims, 6 Drawing Sheets

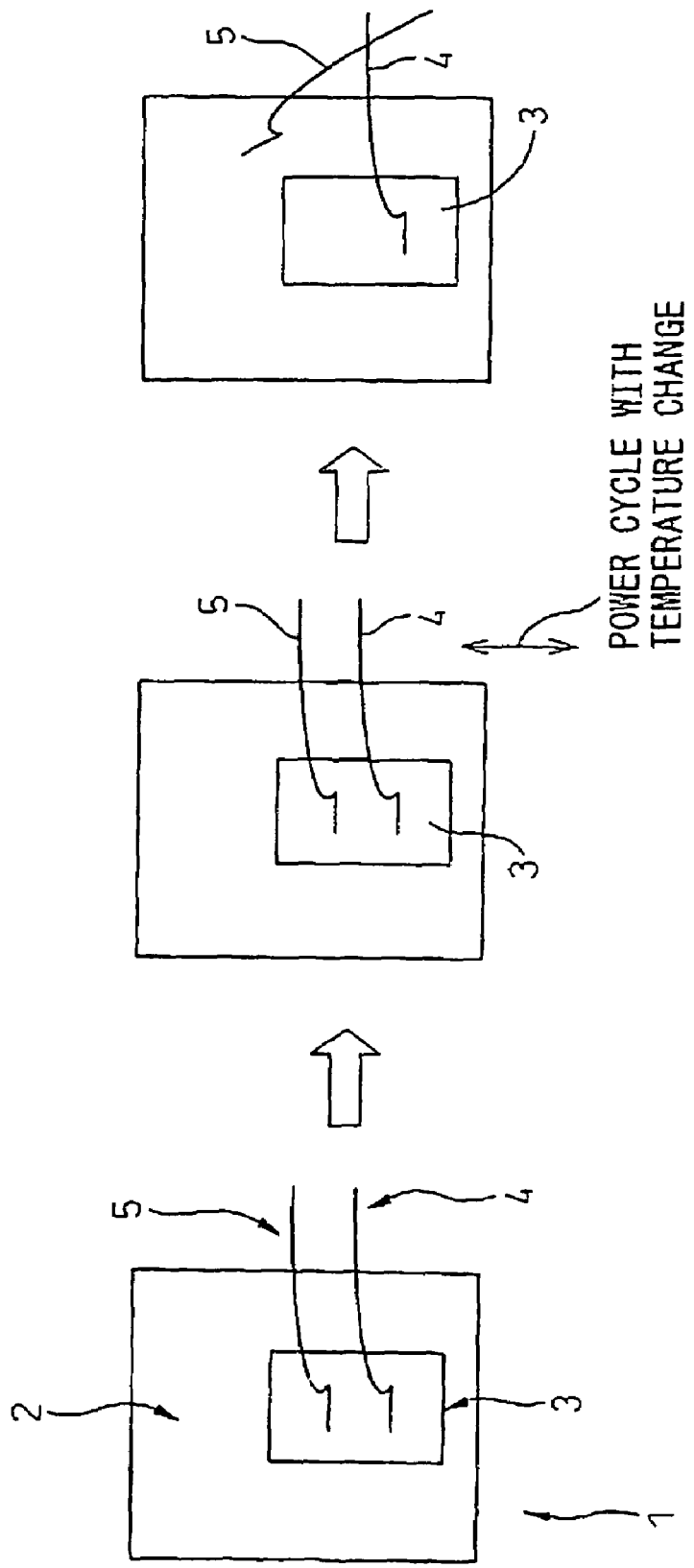

MOTOR DRIVING SYSTEM HAVING POWER SEMICONDUCTOR MODULE LIFE DETECTION FUNCTION

BACKGROUND OF THE INVENTION

1. Field of the Invention

The present invention relates to a motor driving system, for driving a motor, using a power semiconductor module formed, by wiring, on a power semiconductor chip.

2. Description of the Related Art

A drive circuit, to drive a power device such as a motor, employs a power semiconductor module having a power semiconductor chip to control the drive current. The power semiconductor module having the power semiconductor chip controls the drive current by being energized intermittently. After the long intermittent energizing operation, the difference in the coefficient of linear expansion between the electrode and the wire, etc. and the repeated sharp temperature change during the drive operation combine to generate a thermal stress in the wire connection boundary. Especially, the larger wire diameter, the larger wire rigidity so that a conspicuous thermal stress in the wire connection boundary is generated. Thus, the wire is liable to be separated or otherwise damaged at the connection boundary, thereby posing the problem of a reduced endurance to power cycles and heat cycles (See Japanese Unexamined Patent Publication No. 2003-303845, for example).

In the case where the connecting surface (electrode surface), between the semiconductor chip and the main circuit wire, connected in the power semiconductor module is degenerated to separate the main circuit wire from the electrode of the semiconductor chip as described above, the power supply to the power devices would fail.

The separation of the wire from the electrode depends on the amount and frequency of temperature change of the semiconductor chip on the one hand and the intermittently energizing condition and the operating environment on the other hand. Therefore, the separation of the wire is affected considerably by the actual operation of the user and the time of separation is difficult to predict.

In view of this, according to the prior art, the service life is calculated on the assumption that the power semiconductor chip is used under a maximum load in a predetermined cycle of operation.

In the case where the service life of the power semiconductor module is calculated based on a maximum load imposed on the power semiconductor chip as described above, it may happen that the power semiconductor chip is replaced in spite of the fact that the actual load is lighter than the assumed load or power cycle and the power semiconductor chip is still usable. In the case where the load actually imposed is heavier than the assumed load or power cycle, on the contrary, the power semiconductor chip may be damaged before being replaced at the time of expiry of the calculated service life.

Therefore, it is desirable that the service life in terms of power cycles of the power semiconductor chip is accurately determined and the power semiconductor module is effectively used to the end of the semiconductor life while being replaced before any fault which may occur, thereby assuring satisfactory preventive maintenance.

Accordingly, it is an object of this invention to predict the separation of the main circuit wire and prevent the operation failure of the power semiconductor module, and the motor driving system using the power semiconductor module, which otherwise might be caused by the separation of the main circuit wire.

SUMMARY OF THE INVENTION

According to the invention, there is provided a motor driving system including a power semiconductor module having a built-in means for predicting the separation of the main circuit wire, whereby the approach of the separation time of the main circuit wire can be predicted. As a result, the time to replace the power semiconductor module used in the power devices such as the motor driving system is clarified thereby to prevent the operation failure of the motor driving system.

The motor driving system according to the invention comprises a module carrying a power semiconductor chip, wherein the power semiconductor chip includes a main circuit wire and a dummy wire connected to the electrode of the power semiconductor, and wherein the power semiconductor chip performs the rectifying operation and/or the switching operation to drive the motor.

The main circuit wire is connected to the electrode of the power semiconductor chip to supply power between the power semiconductor chip and external devices. The dummy wire, on the other hand, is arranged to predict the separation of the main circuit wire and has no effect on the energizing of the main circuit wire. Even in the case where the dummy wire is separated from the electrode, therefore, the energizing of the main circuit wire is not adversely affected.

The dummy wire is connected to the same electrode to which the main circuit wire is connected, or in the case where the environment of a different electrode is considered subjected to a similar temperature change as the main circuit wire, the dummy wire may alternatively be connected to the particular different electrode.

The connecting portions of the main circuit wire and the dummy wire with the electrode exposed to a similar operating environment such as the temperature change are considered to degenerate in a similar manner. In such a case, the separation of the main circuit wire can be predicted based on the separation of the dummy wire.

According to the invention, the connection strength with the electrode is set lower for the dummy wire than for the main circuit wire. The wires are separated in the ascending order of connection strength. The dummy wire set at a low connection strength, therefore, is separated before the main circuit wire thereby to positively predict the separation of the main circuit wire before the actual separation thereof.

Also, a plurality of dummy wires of the same or different connection strengths may be connected.

In the case where a plurality of dummy wires having the same connection strength are connected, the separation of the main circuit wire can be positively predicted based on separation of any one of the dummy wires even if the variations in actual connection strength or separation phenomenon may change the time of separation of the dummy wires.

In the case where a plurality of dummy wires of different connection strength are connected, on the other hand, the degeneration degree can be determined by detecting the separation of the dummy wires sequentially.

The wires and the electrode can be connected to each other by wire bonding or soldering.

In the case of connection by wire bonding between the wires and the electrode, the main circuit wire and the dummy wire are connected under different wire bonding conditions to the electrode, resulting in different connection strength between the dummy wire and the main circuit wire.

The bonding conditions include the pressure force and/or the ultrasonic power applied to the main circuit wire and the dummy wire. By adjusting the bonding conditions, the dummy wire is set to a lower connection strength than the main circuit wire.

In another method of adjusting the connection strength, the main circuit wire and the dummy wire, of different diameters, are connected to the electrode by wire bonding.

In the case where wires of different diameters are connected by wire bonding under the same bonding conditions, the different diameters result in different connection strength. By setting the dummy wire to a larger diameter than the main circuit wire, therefore, the dummy wire is set to a lower connection strength.

Assume, on the other hand, that the wires and the electrode are connected by soldering. The main circuit wire and the dummy wire are connected to the electrode by soldering under different soldering conditions. In this way, the dummy wire and the main circuit wire are differentiated from each other in connection strength.

The soldering conditions may include the soldering area and the soldering length. By setting the dummy wire to a small soldering area and/or a short soldering length, the connection strength of the dummy wire can be decreased.

The motor driving system according to the invention comprises a detection means to detect the connection condition between the dummy wire and the electrode. The detection means outputs a detection signal through a photo coupler. This detection signal indicates that the dummy wire arranged in the power semiconductor module has been separated from the electrode, and therefore the separation of the main circuit wire from the electrode can be predicted. This prediction, in turn, makes it possible to determine and manage the time of replacing the power semiconductor module.

The motor driving system according to the invention issues a message based on the detection signal and thus can indicate that the service life of the power indicate semiconductor module is about to expire and the time to replace the power semiconductor module.

The motor driving system can predict the separation of the main circuit wire by detecting the separation of the dummy wire. It is therefore possible to prevent the motor drive operation failure by replacing the power semiconductor module beforehand.

According to this invention, the separation of the main circuit wire can be predicted. Also, the operation failure of the power semiconductor module and the motor driving system using the power semiconductor module which otherwise might be caused by the separation of the main circuit wire can be prevented.

These and other objects, features and advantages of the present invention will be more apparent in light of the detailed description of exemplary embodiments thereof as illustrated by the drawings.

BRIEF DESCRIPTION OF THE DRAWINGS

FIG. 1 is a diagram for explaining the outline of a power semiconductor module according to the invention.

DETAILED DESCRIPTION

Figure 2A:
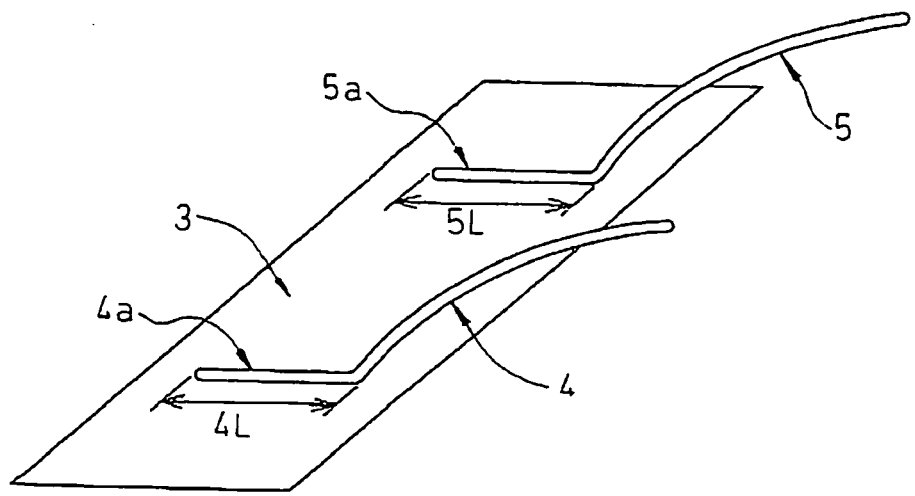
FIG. 2a is a diagram for explaining the connection between the main circuit wire and the dummy wire according to the invention.

Embodiments of the invention are described in detail below with reference to the drawings.

FIG. 1 is a diagram for explaining the outline of a power semiconductor module of a motor driving system according to the invention. In FIG. 1, a power semiconductor chip 2 includes an electrode 3 for connecting the wires. The electrode 3 is connected with a main circuit wire 4 to supply power between the power semiconductor chip 2 and external devices and a dummy wire 5 to predict the separation of the main circuit wire 4. The circuit is so configured that the dummy wire 5 has no effect on the energizing of the main circuit wire 4 and, even in the case where the dummy wire 5 is separated from the electrode 3, the energizing of the main circuit wire 4 is not adversely affected.

The connection strength of the connecting portion between the dummy wire 5 and the electrode 3 is set lower than that of the connecting portion between the main circuit wire 4 and the electrode 3. In the power semiconductor module 1, thermal stress is generated in the connecting portion by the temperature change due to the power cycles in which the power semiconductor chip 2 is energized intermittently thereby to reduce the connection strength of the connecting portion. The reduction in connection strength depends on the amount and frequency of temperature change of the power semiconductor chip. The dummy wire 5 mounted with a lower connection strength, therefore, is separated from the electrode 3 earlier than the main circuit wire 4.

In the motor driving system according to the invention, the separation of the dummy wire 5 of the power semiconductor module 1 from the electrode 3 is detected, so that the separation of the main circuit wire 4 is predicted before actual separation thereof from the electrode 3 and the service life of the power semiconductor module is forecast.

Figure 2B:
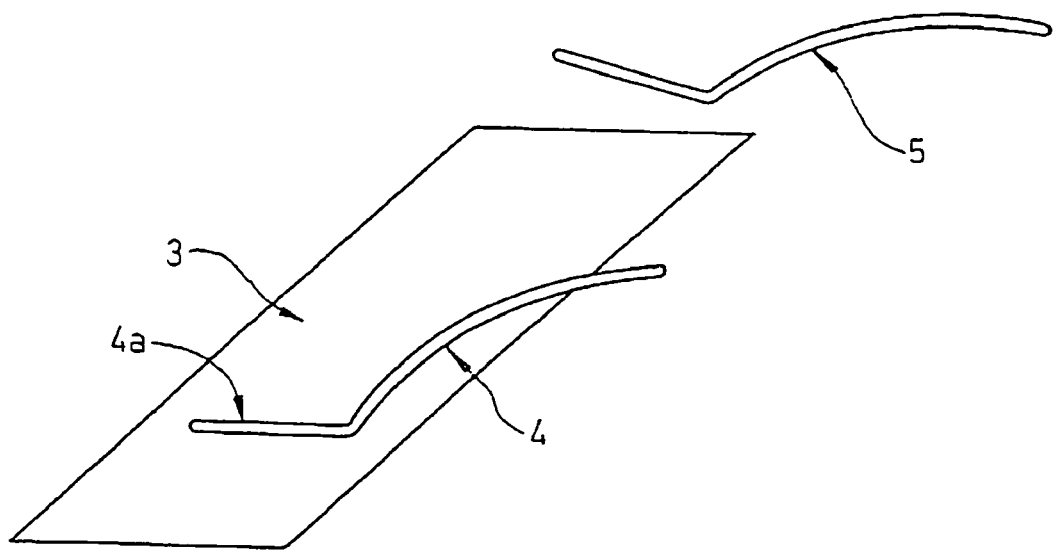
FIG. 2b is another diagram for explaining the connection between the main circuit wire and the dummy wire according to the invention.

FIGS. 2a, 2b are diagrams for explaining the connection of the main circuit wire and the dummy wire. FIG. 2a shows the state in which the main circuit wire 4 and the dummy wire 5 are connected to the electrode 3. The main circuit wire 4 is connected by bonding the connecting portion 4a thereof to the electrode 3. Similarly, the dummy wire 5 is connected by bonding the connecting portion 5a thereof to the electrode 3. The connection strength of the connecting portion 5a of the dummy wire 5 is lower than that of the connecting portion 4a of the main circuit wire 4. In the case where the temperature change is repeated due to power cycles in which the power semiconductor chip 2 is energized intermittently, therefore, the dummy wire 5 is separated from the electrode 3 earlier than the main circuit wire 4 (FIG. 2b).

Figure 3A:
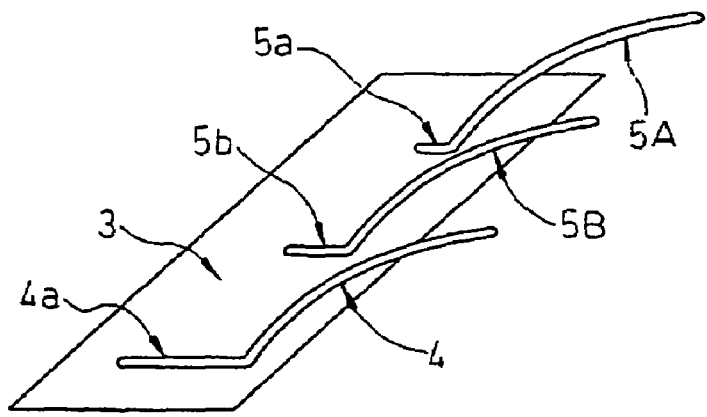
FIG. 3a shows an example having a plurality of dummy wires according to the invention.
Figure 3B:
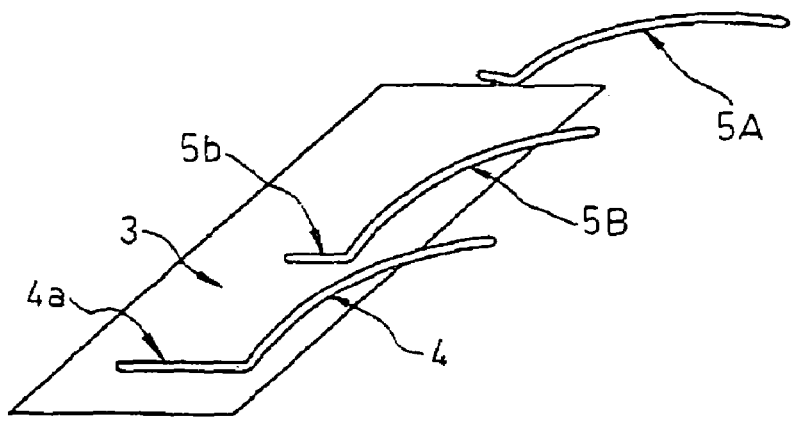
FIG. 3b shows another example having a plurality of dummy wires according to the invention.
Figure 3C:
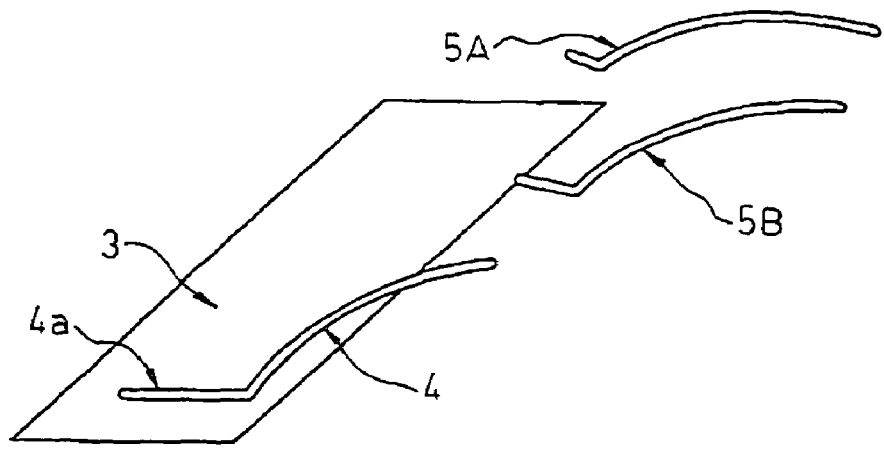
FIG. 3c shows still another example having a plurality of dummy wires according to the invention.

FIGS. 3a to 3c show an example having a plurality of dummy wires. The dummy wires have different connection strength, so that the service life of the connecting portion of the main circuit wire can be predicted in steps.

FIG. 3a shows an example of configuration in which the main circuit wire 4 and two dummy wires 5A, 5B are connected to the electrode 3 through the connecting portions 4a, 5a, 5b, respectively.

The connection strength of the connecting portions 4a, 5b, 5a are set lower in that order. The main circuit wire 4 has the highest connection strength, while the dummy wires 5B, 5A are decreased in connection strength in that order. After repeated temperature change in power cycles in which the power semiconductor chip 2 is energized intermittently, the connecting portion 5a of the dummy 5A lowest in connection strength is first separated from the electrode 3 (FIG. 3b), and the subsequent temperature change separates the dummy wire 5B of the next lowest connection strength from the electrode 3 (FIG. 3c). After further repetition of temperature change in power cycles in which the power semiconductor chip 2 is energized intermittently, the main circuit wire 4 also comes to be separated from the electrode 3.

In view of the fact that the wires are separated in ascending order of connection strength, the service life of the connecting portion of the main circuit wire 4 can be predicted in steps by detecting the separation of the dummy wires 5A, 5B.

In addition, a plurality of dummy wires may have the same connection strength. There are variations in the actual connection strength and the phenomenon of separation and a dummy wire is not necessarily separated at a predicted time of degeneration. In spite of a variation in dummy wire separation, therefore, the separation of the main circuit wire can be positively predicted by detecting the separation of any of the dummy wires.

The known methods of connecting the wires to the electrode include, for example wire bonding and soldering. Wire bonding includes the ball bonding (thermosonic bonding using heat and ultrasonic wave) using a ball prepared by fusing the forward end of the wire, and wedge bonding (ultrasonic bonding) for connecting the wire directly using a bonding tool.

In the ball bonding process, the forward end of the wire supplied through a guide in a capillary is fused by sparks into the shape of ball and the ball is bonded on the pad on the semiconductor chip side. Then, the bonding is completed by ultrasonic energy and heating from a stage.

In the wedge bonding process, on the other hand, a wedge tool is mounted at the forward end of a horn adapted to be vibrated by an ultrasonic vibrator, and the wire supplied from a wire feeder is held at the bonding point by the forward end of the wedge tool. Under this condition, pressure force and ultrasonic vibration are applied to the wire through the wedge tool. Heat is generated on the bonding surface based on the friction between the wire and the bonding point, so that the wire is plastically deformed and connected to the bonding point.

According to the invention, the connection strength of the dummy wire can be adjusted in various ways in accordance with the connecting method in which the wire is connected to the electrode.

In the case where the wire is connected by wire bonding, for example, the connection strength of the dummy wire can be adjusted according to the bonding conditions.

In the case where the wire is connected by ball bonding, on the other hand, the bonding conditions include the heating temperature of the electrode and the wire, the time during which the ultrasonic wave is applied, the ultrasonic wave power with which the wire is plastically deformed and the load, from the capillary, to hold the wire.

In the case where the heating temperature is high, the diffusion bonding of gold, between a gold wire and the electrode, for example, becomes active and improves the bonding. In the case of a resin substrate, the bonding characteristic is said to be degenerated by the softening of the substrate. The bonding is the phenomenon of diffusion due to heat and ultrasonic energy combined, and therefore a sufficient bonding cannot be secured if the application time of ultrasonic wave is short. Also, the applied ultrasonic power contributes, as ultrasonic energy, to the plastic deformation of the wire by combining with the application time of ultrasonic waves. An excessively large power, however, would deform the wire to an unnecessary degree and reduce the strength. An insufficient load, on the other hand, would lead to an insufficient wire holding power at the time of application of ultrasonic energy, resulting in a bonding failure (See Japanese Unexamined Patent Publication No. 2000-183117). The bonding conditions for ultrasonic bonding include the ultrasonic wave application time, the ultrasonic wave application output and the load (See Japanese Unexamined Patent Publication No. 5-74876).

As described above, in the case where the wire is connected by wire bonding, the connection strength of the dummy wire can be set in accordance with the pressure force or ultrasonic power included in the bonding conditions, and the pressure force or the ultrasonic power, in turn, can be adjusted by the current and/or the application time of the bonding device.

Figure 4A:
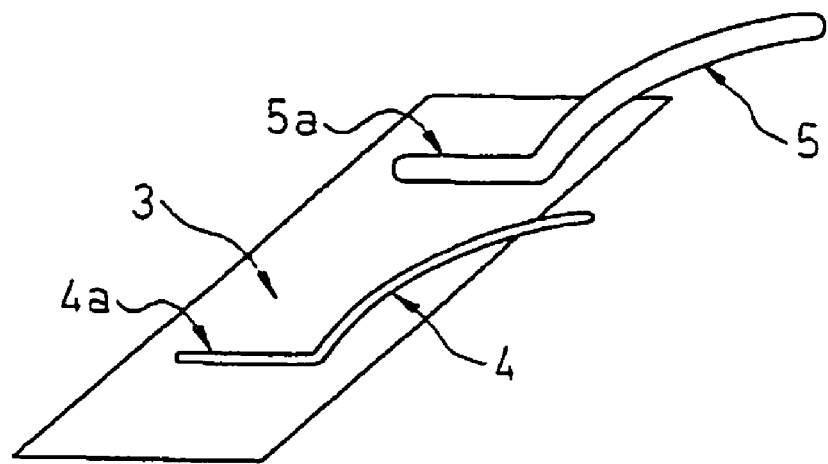
FIG. 4a shows an example having dummy wires of different diameters.
Figure 4B:
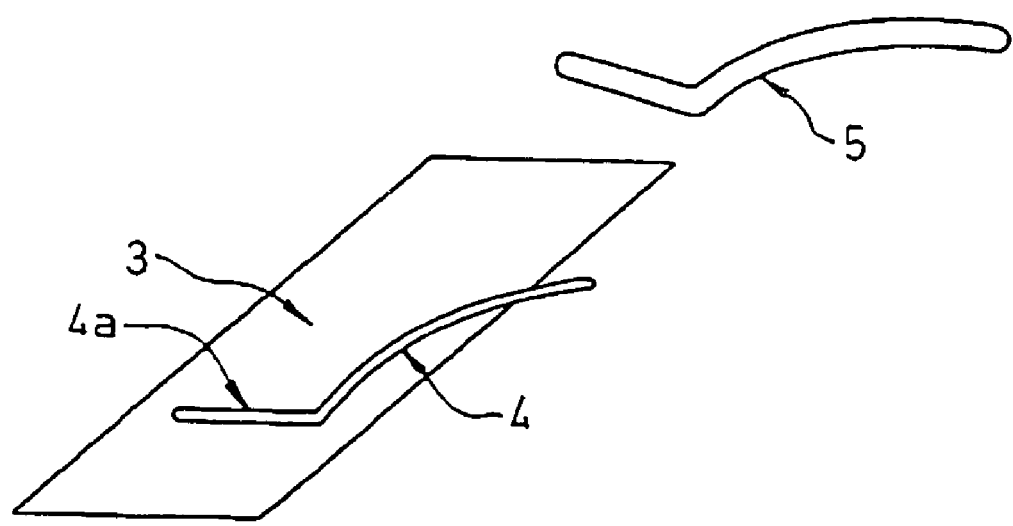
FIG. 4b shows another example having dummy wires of different diameters.

The connection strength can be changed also by differentiating the diameter of the main circuit wire and that of the dummy wire from each other. FIGS. 4a, 4b are diagrams showing an example of dummy wires having different diameters. FIGS. 4a, 4b show an example of configuration in which the main circuit wire 4 and the dummy wire 5 are connected to the electrode 3 through connecting portions 4a, 5a, respectively. By differentiating the diameter of the dummy wire 5 from that of the main circuit wire 4, the connection strength can be differentiated from each other. In the case where wires of different diameters are connected under the same bonding conditions, the resultant difference in plastic deformation of the wires leads to a different connection strength with the electrode. As a result, the dummy wire 5 can be set to a lower connection strength than the main circuit wire 4. As shown in FIG. 4a, for example, if the dummy wire 5 whose diameter is larger than that the main circuit wire 4 is connected to the electrode 3 under the same bonding conditions as the main circuit wire 4, the dummy wire 5 is lower in connection strength than the main circuit wire 4, and therefore separated earlier than the main circuit wire 4 (FIG. 4b).

Although the lengths 4L, 5L of the connecting portions 4a, 5a in FIG. 2a are equal to each other, the connection strengths may be adjusted by differentiating the lengths 4L, 5L of the connecting portions 4a, 5a. Namely, if the length 5L of the connecting portion 5a in FIG. 2a is shorter than the length 4L of the connecting portions 4a, the dummy wire 5 is lower in connection strength than the main circuit wire 4 and, therefore, separates earlier than the main circuit wire 4.

The main circuit wire 4 and the dummy wire 5 can also be connected to the electrode 3 by soldering and, similarly, the connection strength can be differentiated by differentiating the soldering conditions. The soldering conditions include the soldering area and the soldering length (See the length 4L, 5L of the connecting portions 4a, 5a in FIG. 2a).

In the power semiconductor module 1, the main circuit wire 4 and the dummy wire 5 may be connected to either the same electrode 3 or different electrodes. In the case where the main circuit wire 4 and the dummy wire 5 are connected to different electrodes, the dummy wire 5 is preferably connected to an electrode in an environment subjected to a temperature change similar to the main circuit wire 4.

Next, an example of a circuit configuration to detect the separation of the dummy wire from the electrode by detecting the connection condition of the dummy wire is explained with reference to FIGS. 5 to 7.

Figure 5:
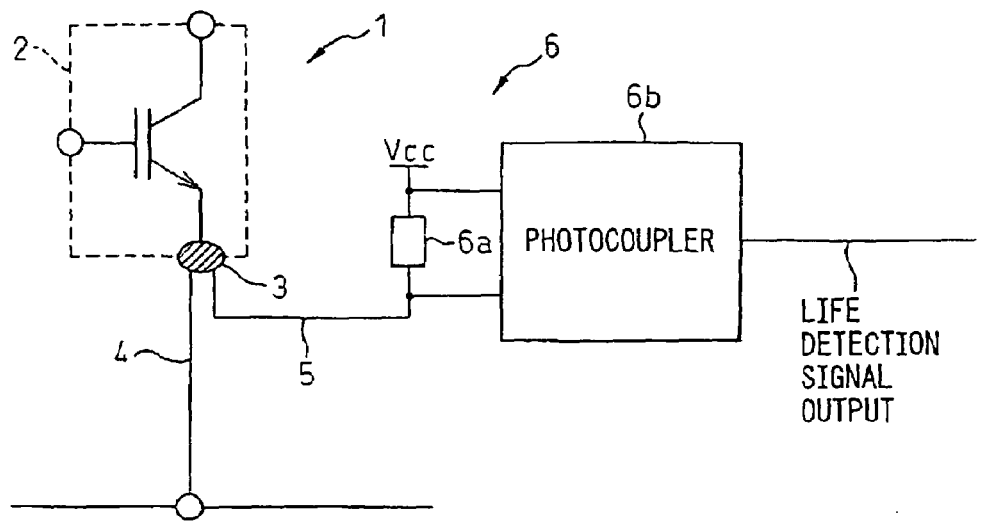
FIG. 5 is a diagram for explaining an example of configuration of a detection circuit according to the invention.

FIG. 5 is a diagram for explaining an example of a configuration of the detection circuit. In the power semiconductor module 1 shown in FIG. 5, the electrode 3 of the power semiconductor chip 2 is connected to the main circuit wire 4 and the dummy wire 5.

The detection circuit 6 for detecting the connection condition of the dummy wire 5 can be configured of a resistor 6a and a photocoupler 6b. The one end of the resistor 6a is connected to a power supply Vcc, and the other end thereof is connected to an end of the dummy wire 5. As long as the dummy wire 5 is connected to the electrode 3, therefore, a predetermined voltage is generated across the resistor 6a. Once the dummy wire 5 is separated from the electrode 3, however, no voltage is generated across the resistor 6a. The photocoupler 6b outputs a life detection signal by detecting the voltage across the resistor 6a.

The motor driving system according to the invention can generate a message based on the life detection signal output from the detection circuit 6. The message announced may be the form of voice, characters, image or lamp indicating that the life of the power semiconductor module 1 is about to expire or that the power semiconductor module 1 is required to be replaced.

According to the configuration shown in FIG. 5, if the separation of the main circuit wire 4 is occurred before the separation of the dummy wire 5, the separation of the main circuit wire 4 can also be detected.

Figure 6:
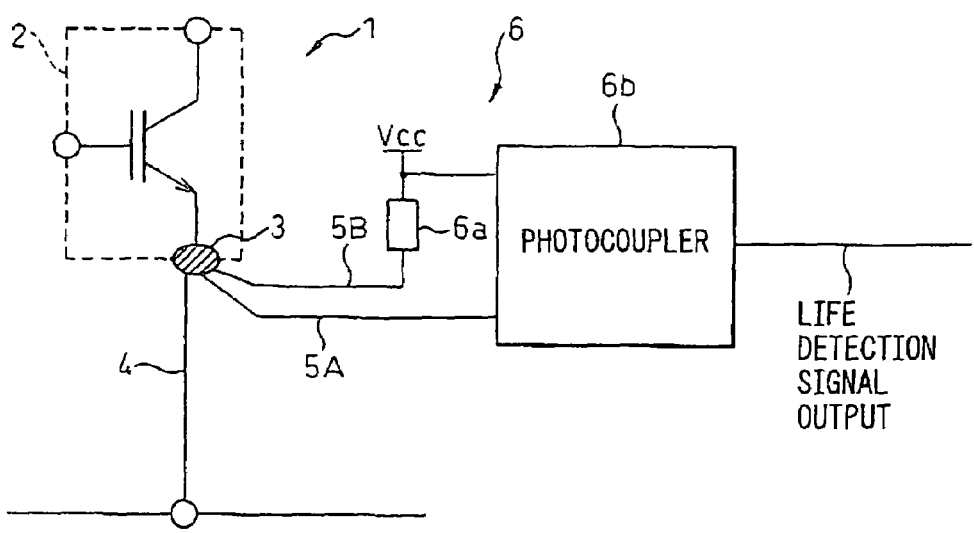
FIG. 6 is a diagram for explaining another example of configuration of a detection circuit according to the invention.
Figure 7:
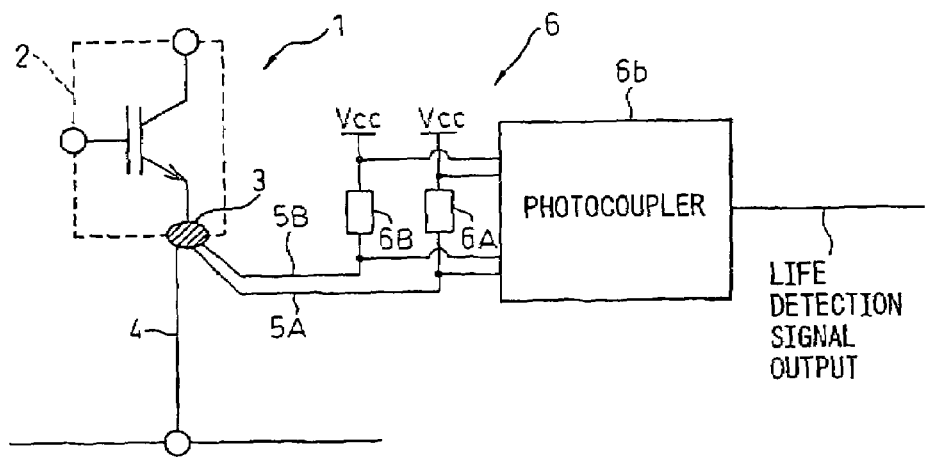
FIG. 7 is a diagram for explaining still another example of configuration of a detection circuit according to the invention.
Figure 8:
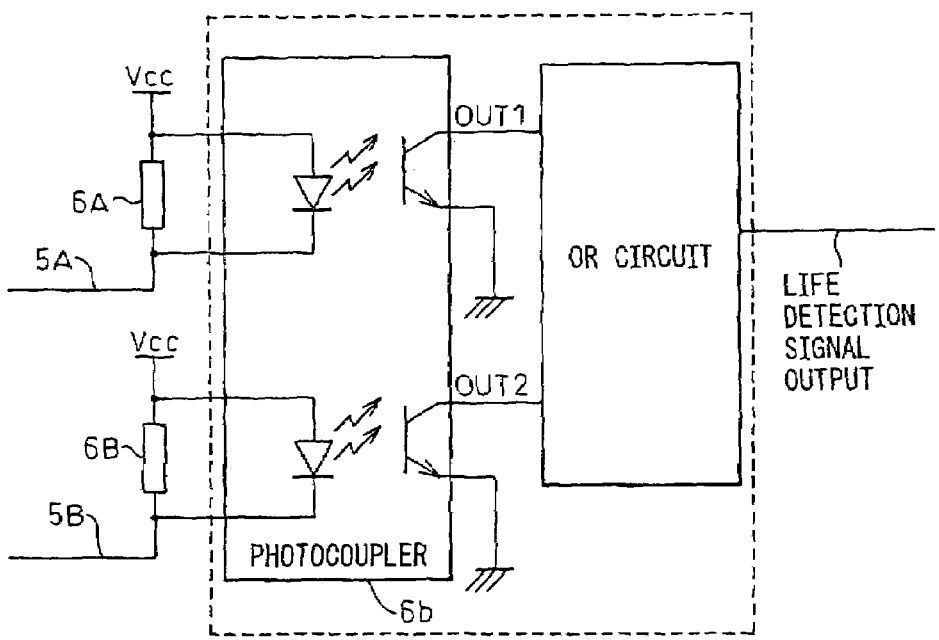
FIG. 8 is a circuit diagram for explaining the detection circuit according to the invention in detail.

FIGS. 6 to 8 are diagrams for explaining another example of a configuration of the detection circuit including a plurality of dummy wires.

In the power semiconductor module 1 of FIG. 6, the main circuit wire 4 and two dummy wires 5A, 5B are connected to the electrode 3 of the power semiconductor chip 2.

The detection circuit 6 for detecting the connection condition of the dummy wires 5A, 5B can be configured of a resistor 6a and a photocoupler 6b. The one end of the resistor 6a is connected to a power supply Vcc and the other end thereof is connected with an end of the dummy wire 5B. Also, the one end of the dummy wire 5A is connected to the photocoupler 6b.

In the case where the dummy wires 5A, 5B are connected to the electrode 3, therefore, a predetermined voltage is generated across the resistor 6a. Once the dummy wire 5A is separated from the electrode 3, on the other hand, the photocoupler 6b cannot detect the voltage. In the case where the dummy wire 5B is separated from the electrode 3, no voltage is generated across the resistor 6a. The photocoupler 6b detects the voltage or energization across the resistor 6a and outputs a life detection signal.

Also, in the power semiconductor module 1 shown in FIG. 7, the electrode 3 of the power semiconductor chip 2 is connected with the main circuit wire 4 and two dummy wires 5A, 5B.

The detection circuit 6 for detecting the connection condition of the dummy wires 5A, 5B can be configured of resistors 6A, 6B and a photocoupler 6b. The one end of the resistor 6A is connected to a power supply Vcc and the other end thereof is connected with an end of the dummy wire 5A. Also, the one end of the resistor 6B is connected to a power supply Vcc and the other end thereof is connected with an end of the dummy wire 5B. As long as the dummy wires 5A, 5B are connected to the electrode 3, a predetermined voltage is generated across the resistors 6A, 6B. In the case where the dummy wire 5A is separated from the electrode 3, however, no voltage is generated across the resistor 6A. In the case where the dummy wire 5B is separated from the electrode 3, on the other hand, no voltage is generated across the resistor 6B. The photocoupler 6b outputs a life detection signal upon detection of the voltages across the resistors 6A, 6B.

FIG. 8 is a circuit diagram for explaining the detection circuit 6 of FIG. 7 in detail. The photocoupler 6b includes two photocoupler units driven by the voltages across the resistors 6A, 6B, respectively, and outputs a life detection signal from output terminals OUT1, OUT2, respectively, through an OR circuit.

The life detection signal detected by the detection circuit 6 is output to the motor driving system and can predict the separation of the main circuit wire 4 of the power semiconductor module 1 or indicate an alarm. This alarm indication makes it possible to replace or repair the power semiconductor module 1 before an operation failure which may occur due to the separation of the main circuit wire 4 of the power semiconductor module 1.

The technique according to the invention is applicable to the power devices supplied with power using the power semiconductor module 1 as well as to the motor driving system.

Although the invention has been shown and described with exemplary embodiments thereof, it should be understood, by those skilled in the art, that the foregoing and various other changes, omissions and additions may be made therein and thereto without departing from the spirit and the scope of the invention.

What is claimed is:

1. A motor driving system comprising a module having a power semiconductor chip;
   wherein the power semiconductor chip includes a main circuit wire and a dummy wire connected to the electrode of the power semiconductor chip;
   wherein the power semiconductor chip module performs at least selected one of a rectifying operation and a switching operation to drive a motor;
   wherein the main circuit wire and the dummy wire are connected to the electrode by soldering;
   wherein the soldering conditions for the main circuit wire are different from those for the dummy wire, so that the connection strength of the dummy wire is different from that of the main circuit wire; and
   wherein the soldering conditions include a selected one of the soldering area and the soldering length.

2. A motor driving system according to claim 1, wherein the connection strength of the dummy wire is lower than the connection strength of the main circuit wire.

3. A motor driving system according to claim 1, comprising a plurality of dummy wires having the same or different connection strengths form each other.

4. A motor driving system according to claim 1,
wherein the main circuit wire and the dummy wire are connected to the electrode by wire bonding; and
wherein the bonding conditions of the main circuit wire are different from those of the dummy wire so that the connection strength of the dummy wire is different from that of the main circuit wire.

5. A motor driving system according to claim 4,
wherein the bonding conditions include at least a selected one of the pressure force and the ultrasonic power applied to the main circuit wire and the dummy wire.

6. A motor driving system according to claim 1, further comprising a detection means to detect the connection between the dummy wire and the electrode.

7. A motor driving system according to claim 6, wherein the detection means outputs a detection signal through a photocoupler.

8. A motor driving system according to claim 6,
wherein information is output based on the detection signal of the detection means.

9. A motor driving system according to claim 2, comprising a plurality of dummy wires having the same or different connection strengths form each other.

10. A motor driving system according to claim 2,
wherein the main circuit wire and the dummy wire are connected to the electrode by wire bonding; and
wherein the bonding conditions of the main circuit wire are different from those of the dummy wire so that the connection strength of the dummy wire is different from that of the main circuit wire.

11. A motor driving system according to claim 3,
wherein the main circuit wire and the dummy wire are connected to the electrode by wire bonding; and
wherein the bonding conditions of the main circuit wire are different from those of the dummy wire so that the connection strength of the dummy wire is different from that of the main circuit wire.

12. A motor driving system according to claim 9,
wherein the main circuit wire and the dummy wire are connected to the electrode by wire bonding; and
wherein the bonding conditions of the main circuit wire are different from those of the dummy wire so that the connection strength of the dummy wire is different from that of the main circuit wire.

13. A motor driving system according to claim 2,
wherein the main circuit wire and the dummy wire are connected to the electrode by soldering; and
wherein the soldering conditions for the main circuit wire are different from those for the dummy wire, so that the connection strength of the dummy wire is different from that of the main circuit wire.

14. A motor driving system according to claim 3,
wherein the main circuit wire and the dummy wire are connected to the electrode by soldering; and
wherein the soldering conditions for the main circuit wire are different from those for the dummy wire, so that the connection strength of the dummy wire is different from that of the main circuit wire.

15. A motor driving system according to claim 9,
wherein the main circuit wire and the dummy wire are connected to the electrode by soldering; and
wherein the soldering conditions for the main circuit wire are different from those for the dummy wire, so that the connection strength of the dummy wire is different from that of the main circuit wire.

16. A motor driving system according to claim 7,
wherein information is output based on the detection signal of the detection means.

\* \* \* \* \*